United States Patent [19]
Shimada

[11] Patent Number: 5,814,923
[45] Date of Patent: Sep. 29, 1998

[54] PIEZOELECTRIC THIN-FILM DEVICE, PROCESS FOR PRODUCING THE SAME, AND INK JET RECORDING HEAD USING SAID DEVICE

[75] Inventor: Masato Shimada, Suwa, Japan

[73] Assignee: Seiko Epson Corporation, Tokyo, Japan

[21] Appl. No.: 696,914

[22] PCT Filed: Dec. 27, 1995

[86] PCT No.: PCT/JP95/02721

§ 371 Date: Oct. 21, 1996

§ 102(e) Date: Oct. 21, 1996

[87] PCT Pub. No.: WO96/20503

PCT Pub. Date: Jul. 4, 1996

[30] Foreign Application Priority Data

Dec. 27, 1994 [JP] Japan .................................. 6-325633

[51] Int. Cl.$^6$ .................................................. H01L 41/08
[52] U.S. Cl. .................................................. 310/800
[58] Field of Search .................................................. 310/800

[56] References Cited

U.S. PATENT DOCUMENTS

| | | | |
|---|---|---|---|
| 4,565,642 | 1/1986 | Jyomura et al. | 252/62.9 |
| 4,636,908 | 1/1987 | Yoshihara et al. | 361/321 |
| 4,862,029 | 8/1989 | Kasai et al. | 310/311 |
| 5,032,471 | 7/1991 | Sakata et al. | 428/699 |
| 5,093,291 | 3/1992 | Kawabata et al. | 501/134 |
| 5,126,615 | 6/1992 | Takeuchi et al. | 310/330 |
| 5,141,903 | 8/1992 | Kawabata et al. | 501/134 |
| 5,173,460 | 12/1992 | Kuang et al. | 501/134 |
| 5,210,455 | 5/1993 | Takeuchi et al. | 310/328 |
| 5,430,344 | 7/1995 | Takeuchi et al. | 310/330 |
| 5,631,040 | 5/1997 | Takuchi et al. | 427/100 |
| 5,643,379 | 7/1997 | Takeuchi et al. | 156/89 |
| 5,645,753 | 7/1997 | Fukuoka et al. | 252/62.9 PZ |
| 5,658,485 | 8/1997 | Cava et al. | 252/62.9 |

FOREIGN PATENT DOCUMENTS

| | | | |
|---|---|---|---|
| 54-105799 | 8/1979 | Japan | 310/800 |
| 63-238799 | 10/1988 | Japan | H04R 17/10 |
| 1-96368 | 4/1989 | Japan | C23C 14/08 |
| 2-248089 | 10/1990 | Japan | H01L 49/02 |
| 5-235268 | 9/1993 | Japan | H01L 27/04 |

Primary Examiner—Thomas M. Dougherty
Attorney, Agent, or Firm—Ladas & Parry

[57] ABSTRACT

A piezoelectric thin-film device is disclosed which comprises: a piezoelectric film of a polycrystalline material; and two electrodes, the piezoelectric film being sandwiched between the two electrodes, wherein the piezoelectric film comprises a three-component PZT containing 5% by mole or more of a third component and having a thickness of not more than 5 $\mu$m, and the deviation of Pb content of the piezoelectric film in the thicknesswise direction thereof is within ±5%. The piezoelectric thin-film device has good properties, and the use of the piezoelectric thin-film device realizes miniaturization and increase in resolution of a head for ink jet recording. Further, the piezoelectric device has an additional advantage that an ink can be ejected at a high pressure and, further, driving at a high frequency is possible.

10 Claims, 3 Drawing Sheets

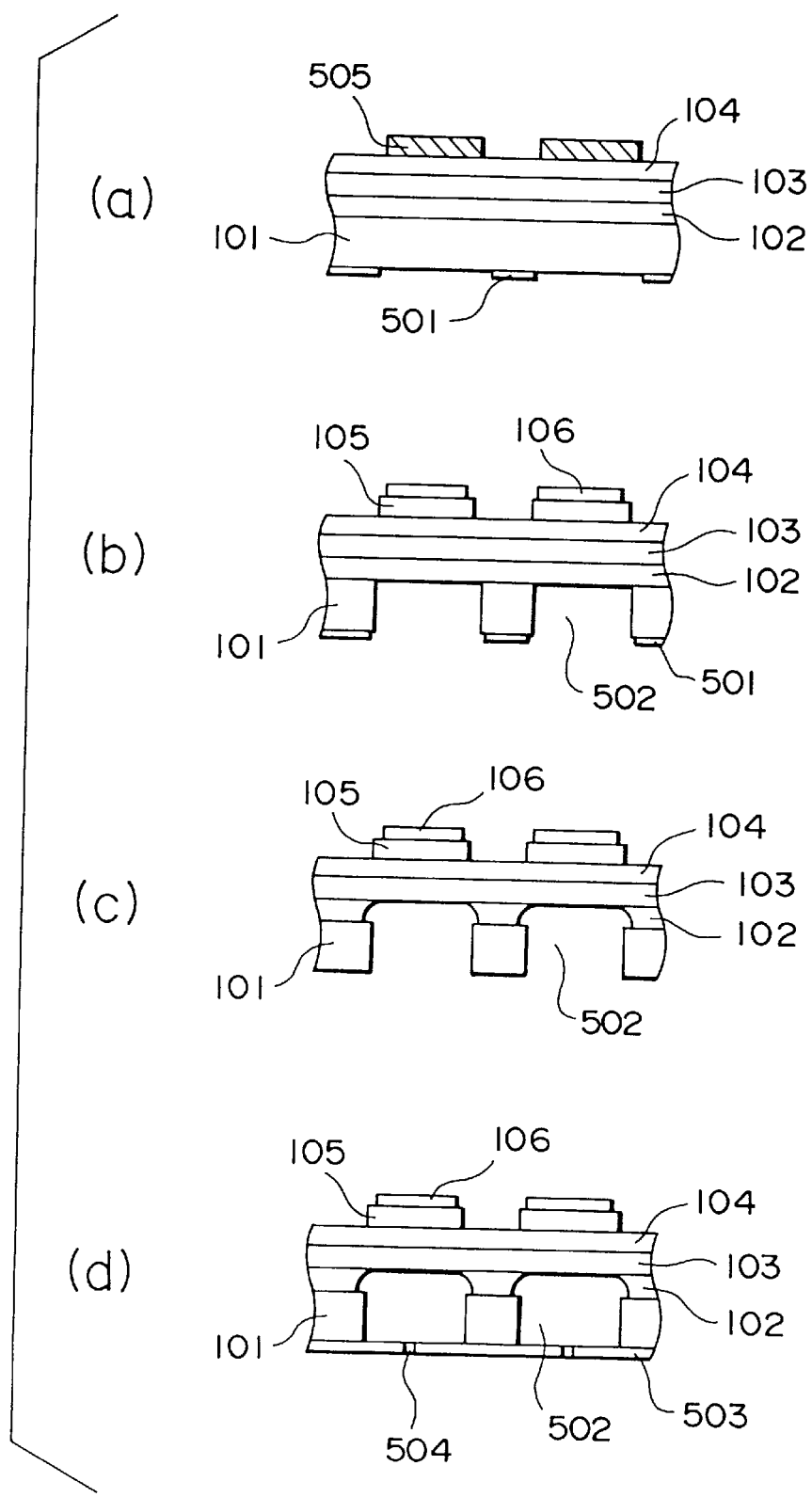
F I G . 2

PIEZOELECTRIC THIN-FILM DEVICE, PROCESS FOR PRODUCING THE SAME, AND INK JET RECORDING HEAD USING SAID DEVICE

BACKGROUND OF THE INVENTION

1. Field of the Invention

The present invention relates to a piezoelectric thin-film device which can convert electric energy to mechanical energy, or vice versa. More particularly, the present invention relates to a piezoelectric thin-film device usable in actuators, pressure sensors, thermal sensors, heads for ink jet recording and the like.

2. Background Art

A piezoelectric device of a three-component system comprising a third component in addition to lead zirconate titanate ("two-component PZT") is known to have good properties. Therefore, a thin piezoelectric device made from the three-component PZT advantageously will enables an ink jet recording head to be further miniaturized.

However, it is difficult to prepare a piezoelectric thin-film device, of a three-component system, having good properties.

So far as the present inventors know, there is no report on a piezoelectric thin film wherein attention has been focused on deviation of lead content in the thicknesswise direction of the piezoelectric thin film and the deviation been regulated to improve good properties of the piezoelectric thin film.

For example, ferroelectric materials using a two-component PZT is disclosed in Applied Physics Letters, 1991, Vol. 58, No. 11, pp. 1161–1163. Although this report discloses in detail properties of the ferroelectric materials, no evaluation is made for the properties of the ferromagnetic materials as an piezoelectric material.

Further, Japanese Patent Laid-Open Publication No. 504740/1993 discloses a recording head using a two-component PZT. It, however, neither discloses nor suggests the fact that, for a three-component system, the regulation of lead content in the thicknesswise direction leads to advantageous results.

SUMMARY OF THE INVENTION

We have now found that, in the case of a piezoelectric thin film using a three-component PZT, the deviation of lead content in the thicknesswise direction has a great effect on the properties thereof. Further, we have established a process for producing a piezoelectric thin film which enables the lead content deviation the thicknesswise direction to be successfully regulated.

Accordingly, an object of the present invention is to provide a piezoelectric thin-film device, having good properties, using a three-component PZT.

The piezoelectric thin-film device according to the present invention comprises: a piezoelectric film of a polycrystalline material; and two electrodes, the piezoelectric film being sandwiched between the two electrodes, wherein the piezoelectric film comprises a three-component PZT containing 5% by mole or more of a third component and having a thickness of not more than 5 μm, and the deviation of Pb content of the piezoelectric film in the thicknesswise direction thereof is within ±5%.

BRIEF DESCRIPTION OF THE DRAWINGS

FIG. 2 is an explanatory view showing a process for producing an ink jet recording head using the piezoelectric thin-film device according to the present invention, wherein FIG. 2(a) shows a monocrystalline Si substrate 101 having thereon a Si oxide film 102 formed by thermal oxidation, an antidiffusion film 103, a lower electrode 104, and a film 505 as a precursor of a piezoelectric film, FIG. 2(b) an assembly prepared by sintering the precursor film 505 in the assembly shown in FIG. 2(a) to convert the precursor film 505 to a piezoelectric film 105, forming an upper electrode 106 on the piezoelectric film 105, and forming a chamber as an ink cavity 502 in the substrate 101 by etching, FIG. 2(c) an assembly prepared by removing the Si oxide film 501 and a part of the Si oxide film 102, formed by thermal oxidation, by etching, and FIG. 2(d) an assembly prepared by adhering an orifice plate 503 having a nozzle opening 504 to the substrate 101.

DETAILED DESCRIPTION OF THE INVENTION

Piezoelectric thin-film device

Figure 1:
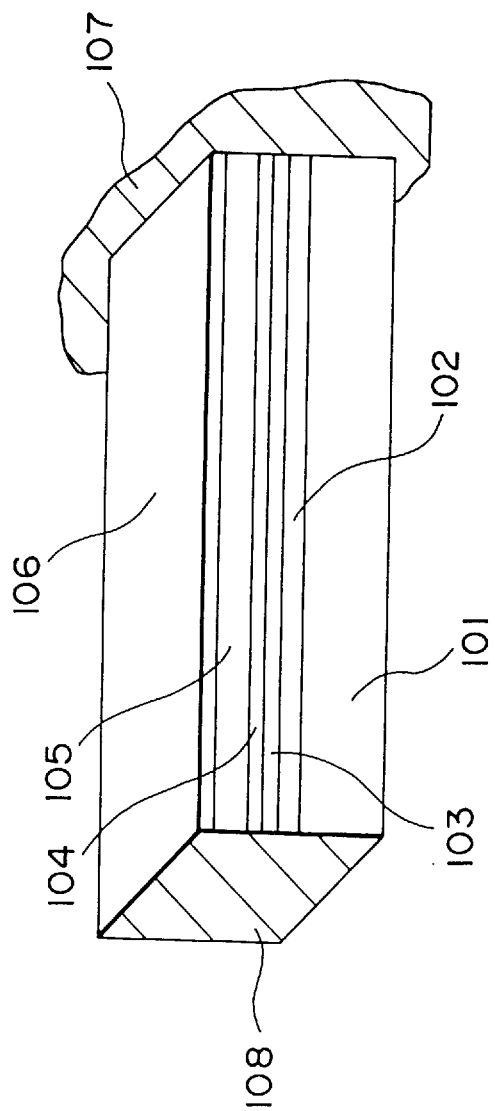
FIG. 1 is a diagram showing the structure of the piezoelectric thin-film device according to the present invention.
Figure 3:
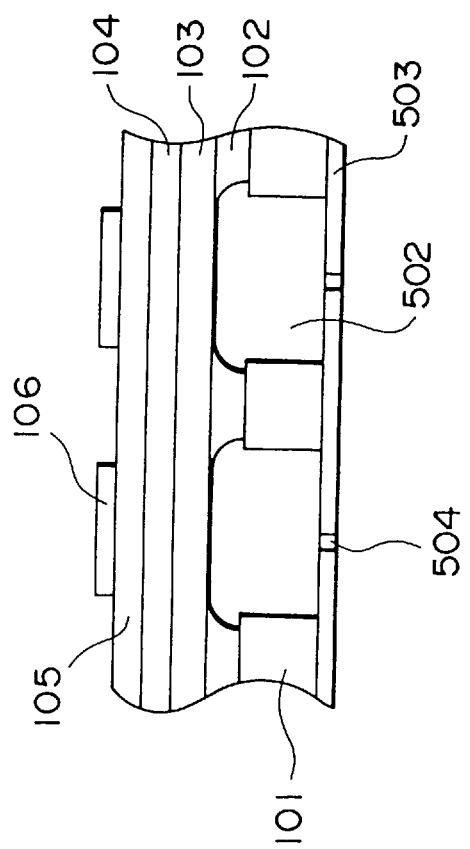
FIG. 3 is a diagram showing another preferred structure of an ink jet recording head using the piezoelectric thin-film device according to the present invention.

The piezoelectric thin-film device according to the present invention comprises: a piezoelectric film of a polycrystalline material; and two electrodes, the piezoelectric film being sandwiched between the two electrodes. The piezoelectric film comprises a three-component PZT containing 5% by mole or more of a third component and has a thickness of not more than 5 μm, and the deviation of Pb content of the piezoelectric film in the thicknesswise direction thereof being within ±5%.

The piezoelectric device according to the present invention has good properties by virtue of regulation of the deviation of lead content in the thicknesswise direction thereof to within ±5%. The displacement of a piezoelectric device is generally said to be expressed by the following equation:

$$\text{Displacement} = a \times d31 \times V = a \times \in 33 \times g31 \times V$$

wherein a represents a proportionality factor, d31 represents a piezoelectric constant, $\in 33$ represents a relative dielectric constant, g31 represents a voltage output factor, and V represents a voltage applied.

According to a preferred embodiment of the present invention, regarding the above equation, the piezoelectric thin-film device according to the present invention exhibits a dielectric constant $\in 33$ of not less than 1500, more preferably not less than 2000, and a piezoelectric constant d31 of not less than 160 pC/N, more preferably not less than 180 pC/N.

According to another preferred embodiment of the present invention, the thickness of the piezoelectric film in the piezoelectric thin-film device according to the present invention is about 1 to 5 μm.

The piezoelectric thin-film device according to the present invention comprises a third component (for example, lead niobate magnesium) in addition to lead zirconate titanate called "two-component PZT". Preferred specific examples of the two-component PZT include those represented by the following formula:

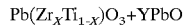

wherein $0.40 \leq X \leq 0.6$ and $0 \leq Y \leq 0.3$, and preferred specific examples of the third component is represented by the following formula:

$$Pb(A_g B_h)O_3$$

wherein A represents a divalent metal selected from the group consisting of Mg, Co, Zn, Cd, Mn, and Ni or a trivalent metal selected from the group consisting of Y, Fe, Sc, Yb, Lu, In, and Cr;

B represents a quinoquevalent metal selected from the group consisting of Nb, Ta, and Sb or a hexavalent metal selected from the group consisting of W and Te;

g and h are ½, provided that when A is a trivalent metal, B is not a sexivalent metal; and when A represents a divalent metal with B representing a quinoquevalent metal, g is ⅓ with h being ⅔.

More preferred examples of the third component include lead niobate magnesium ($Pb(Mg_{1/3}Nb_{2/3})O_3$), lead niobate zinc ($Pb(Zn_{1/3}Nb_{2/3})O_3$), lead niobate nickel ($Pb(Ni_{1/3}Nb_{2/3})O_3$), and lead tungstate magnesium ($Pb(Mg_{1/2}W_{1/2})$).

According to the present invention, the amount of the third component added is not less than 5% by mole, preferably not less than 10% by mole, more preferably not less than 20% by mole.

Further, according a preferred embodiment of the present invention, small amounts of Ba, Sr, Cd, La, Nd, Nb, Ta, Sb, Bi, W, Mo, Ca, Ni, Mn, and Si may be added in order to improve the piezoelectric properties. In particular, the addition of Sr and Ba in an amount of not more than 0.10% by mole is preferred from the viewpoint of improving the piezoelectric properties. Further, the addition of 0.10% by mole of Mn and Ni is preferred from the viewpoint of improving the sintering property.

The structure of piezoelectric thin-film devices will be described in more detail with reference to the accompanying drawings. FIG. 1 shows a piezoelectric thin-film device according to the present invention. The piezoelectric thin-film device comprises a silicon (Si) substrate 101, a Si oxide film 102 formed by thermal oxidation, an antidiffusion film 103, a lower electrode 104 made of, for example, Pt, a piezoelectric film 105, and an upper electrode 106 made of, for example, Au.

In the step of heating and sintering described below, the antidiffusion film functions to prevent Pb from being diffused from the piezoelectric film into the Si oxide film. When Pb is diffused into the Si oxide film, a fear often rises that Pb dissolves the Si oxide film. The antidiffusion film is formed of preferably zirconium oxide, thorium oxide, hafnium oxide, tantalum oxide, or aluminum oxide.

The thickness of the individual layers may be suitably determined. However, the thickness of the Si substrate is generally about 10 to 1000 μm, preferably 100 to 400 μm, the thickness of the Si oxide film formed by thermal oxidation is generally about 0.05 to 3 μm, preferably 0.1 to 1 μm, the thickness of the antidiffusion film is generally about 0.02 to 2 μm, preferably 0.04 to 1 μm, and the thickness of the upper electrode and the lower electrode is generally about 0.05 to 2 μm, preferably about 0.1 to 0.2 μm.

Production of piezoelectric thin-film device

The piezoelectric thin-film device according to the present invention may be produced by any of various thin-film forming methods commonly used in the art, except that the deviation of lead content in the thicknesswise direction of the piezoelectric film is regulated to within ±5%.

Sputtering may be a preferred technique for the preparation of a thin film. Specifically, a PZT sinter comprising specific components is used as a target for sputtering to form an amorphous film as a precursor of a piezoelectric film on an electrode film by sputtering. In this case, the composition of the precursor should be regulated so that sintering of the precursor brings the composition to a three-component PZT containing not less than 5% by mole of the third component. According to a preferred embodiment of the present invention, the precursor is preferably such that the amount of Pb contained in the precursor is larger than the stoichiometric amount thereof. The amount of Pb contained in the precursor is preferably 10 to 30% by mole, more preferably 10 to 20% by mole, larger than the stoichiometric amount thereof.

The precursor in an amorphous state is then crystallized by heating and sintered. Preferably, the heating is carried out in an oxygen atmosphere (for example, in oxygen or in a gas mixture of oxygen with an inorganic gas, such as argon).

We have confirmed such a phenomenon that, in the heat treatment, PbO diffused from the precursor reaches the surface of the precursor to form a PbO film. It is considered that the PbO film inhibits the diffusion of a gas evolved during sintering of the precursor, which is causative of layer separation. For this reason, preferably, the precursor is sintered while controlling sintering conditions so as not to create the formation of a PbO film. Specifically, it is generally preferred to conduct the sintering at a temperature below 888° C. which is an estimated melting point of the PbO film (nomenclature in mineral: massicot). In this context, however, it should be noted that sintering at 888° C. or above is not excluded from the scope of the present invention so far as the control of other sintering conditions can prevent the formation of the PbO film.

According to a preferred embodiment of the present invention, the sintering can be carried out in a single stage. More specifically, the above electrode with a precursor film formed thereon is heated in an oxygen-containing atmosphere (the oxygen concentration being preferably 10 to 100%) at a temperature of 800° to 888° C., preferably 830° to 880° C., more preferably 850° to 870° C. The heating is carried out for a period of time long enough to convert the precursor film to a piezoelectric film having a perovskite crystal structure.

Further, according to another preferred embodiment of the present invention, it is also possible to conduct the sintering in two stages. Two-stage sintering enables the deviation of lead content to be more easily regulated. This is because, in the case of single-stage sintering, the evaporation of Pb and the sintering for crystallization are simultaneously carried out, whereas, in the case of two-stage sintering, sintering for crystallization can be carried out separately from sintering attended with evaporation of Pb. In fact, however, the first sintering for crystallization also causes some evaporation of Pb. Regarding specific heating conditions, the first heating is carried out in an oxygen-containing atmosphere (the oxygen concentration being preferably 10 to 100%) at a temperature below that at which the sintering is carried out in a singe stage, i.e., 700° to 800° C., preferably 730° to 780° C., more preferably 750° to 770° C. The heating is carried out for a period of time long enough to convert the precursor film to a piezoelectric film having a perovskite crystal structure. Subsequently, the second heating is carried out at about 800° to 888° C., preferably 830° to 880° C., more preferably 850° to 870° C.

The first heating step and the second heating step may be continuously carried out. Alternatively, the film after the first heating step may be cooled to room temperature and then subjected to the second heating step.

For the sintering, various heating ovens may be utilized so far as crystallization is achieved. However, preferred is a heating oven wherein the temperature can be raised at a high rate. One example of such a heating oven is a lamp anneal oven. For all the heating methods, the temperature rise rate is preferably not less than 10° C./sec, more preferably not less than 50° C./sec.

An electrode is further provided on the piezoelectric film formed on the electrode to prepare a piezoelectric thin-film device.

Ink jet recording head using piezoelectric thin film

The piezoelectric thin-film device according to the present invention may be used in various applications by taking advantage of good properties thereof.

For example, it can be used as a piezoelectric transducer for an ink jet recording head. The use of the piezoelectric thin-film device according to the present invention can realize a reduction in size of an recording head and increased resolution. Further, the piezoelectric thin-film device according to the present invention is advantageous in that an ink can be ejected at a high pressure and the ink jet recording head can be driven at a high frequency.

FIG. 2(d) shows a cross-sectional view of a preferred embodiment of the recording head utilizing the piezoelectric thin-film device according to the present invention. This recording head comprises: a monocrystalline Si substrate 101 having a piezoelectric thin film and a cavity 502; and a plate 503 having a nozzle 504. A Si oxide film 102 formed by thermal oxidation, an antidiffusion film 103, a lower electrode 104, a piezoelectric film 105, and an upper electrode 106 are provided on the monocrystalline Si substrate (s). The cavity 502 communicates with an ink passage (not shown), and an ink composition fed through the ink passage is resorvoired in the ink cavity 502. A voltage is applied to the piezoelectric film 105 through the lower electrode 104 and the upper electrode 106. The application of the voltage results in deformation of the cavity 502, pressurizing the ink. The pressure ejects the ink through the nozzle 504, enabling ink jet recording.

The recording head can be preferably prepared by the following method. As shown in FIG. 2(a), 1 μm-thick Si oxide films 102 and 501 are formed by wet thermal oxidation on respective sides of a monocrystalline Si substrate 101. Then, the Si oxide film 501 on the back side of the substrate is subjected to a conventional photolithographic process using a photoresist to form a photoresist mask pattern for forming a cavity 502, and the Si oxide film 501 is etched with a buffered hydrofluoric acid solution (a 1:10 mixture of hydrofluoric acid and ammonium fluoride). In this case, etching is conducted in such a manner that the pattern of the Si oxide film 501 coincides with the crystallographic face (111) of the monocrystalline Si substrate 101. That is, in FIG. 2, the monocrystalline Si substrate 101 in its face perpendicular to the paper face is preferably the face (111). The mask pitch of the etching corresponds to the nozzle pitch. In the case of a high-resolution ink jet recording head, the nozzle pitch is, for example, about 140 μm, and, hence, the mask pitch for etching is also brought to about 140 μm. Further, an antidiffusion film 103 and a lower electrode film 104 are formed on the surface of the Si oxide film 102 remote from the back side of the substrate. Furthermore, a film 505 as a precursor of a piezoelectric film is formed on the whole surface of the lower electrode 104, and, as shown in FIG. 2(a), the lower electrode 104 is subjected to the photolithographic process commonly used in the art (for example, a photolithographic process using an etchant based on hydrofluoric acid) to leave the film 505, as the precursor of the piezoelectric film, in its portions above respective ink cavities to be formed. The precursor film 505 is then crystallized by sintering to convert it to a piezoelectric film 105. Thereafter, an upper electrode 106 is formed by a conventional method. The monocrystalline Si substrate 101 is etched with the piezoelectric film 105 and the upper electrode 106 being masked to form an ink cavity 502. Preferably, this etching is conducted by anisotropic etching with, for example, a potassium hydroxide solution. For example, for the potassium hydroxide solution, the selectivity of etching for the direction of the crystallographic face of the monocrystalline Si is very large, and (110) face:(111) face=about 300:1. Therefore, such etching is very advantageous for providing a shape like the ink cavity 502.

Then, as shown in FIG. 2(c), the Si oxide film 501 as the etching mask for the monocrystalline Si substrate 101 and the Si oxide film 102 in its portions on the ink cavity 502 are removed by etching with an aqueous hydrofluoric acid-ammonium fluoride solution.

An orifice plate 503 having a nozzle opening 504 is adhered. Thus, an ink jet recording head shown in FIG. 2(d) is prepared.

FIG. 6 show a cross-sectional view of another preferred embodiment of the ink jet recording head. In this embodiment, a piezoelectric film 105 is formed on the whole surface over the ink cavity 502.

EXAMPLES

The present invention will be described in more detail with reference to the following examples, though it is not limited to these examples only.

Example 1

A monocrystalline Si substrate having a thickness of 400 μm and a diameter of 4 in. was washed with a mixed solution of ammonia, hydrogen peroxide, and water and heated in a steam-containing oxygen atmosphere at 1100° C. for 3 hr, thereby conducting wet oxidation of the Si substrate. Thus, a 1 μm-thick Si oxide film was formed. A 1 μm-thick zirconium oxide film was then formed as an antidiffusion film on the Si oxide film by high-frequency sputtering using a zirconium oxide target. A 0.5 μm-thick platinum film was then formed as a lower electrode on the antidiffusion film by DC sputtering.

Thereafter, a 3 μm-thick precursor of a piezoelectric film was formed on the lower electrode by high-frequency sputtering at a substrate temperature of 200° C. or below by high-frequency sputtering using a PZT sinter, having a controlled composition, as a sputtering target. The precursor film thus formed was amorphous.

The Si substrate with a precursor film formed thereon was heated in a lamp annealer to crystallize and sinter the precursor film, thereby forming piezoelectric films. Heating conditions were such that the Si substrate was heated at a temperature rise rate of 100° C./sec to a temperature indicated in the following Table 1 and kept at that temperature for one min. The heating was carried out in an atmosphere of 100% oxygen.

Further, a 0.5 μm-thick gold film was formed on the piezoelectric films by DC sputtering, thereby preparing piezoelectric thin-film devices.

The PZT films thus obtained each were a three-component PZT film having a composition of lead niobate magnesium-lead zirconate-lead titanate (Pb(Mg$_{1/3}$Nb$_{2/3}$)O$_3$—PbZrO$_3$—PbTiO$_3$) in lead niobate magnesium:lead zirconate:lead titanate=40 mol %:38 mol %:22 mol %.

Further, the distribution of Pb content in the thicknesswise direction of the PZT films was observed by Auger electron spectroscopy. As a result, the deviation of Pb content was found to be as summarized in Table 1.

The piezoelectric thin-film device was subjected to polarization. Specifically, a voltage of 60 V was applied across the Pt film and the Au film for one min. The piezoelectric constant d31 was then measured. The results are as shown in Table 1.

TABLE 1

| Sample No. | Heat treatment temp. | Deviation of Pb content | Piezoelectric constant (pC/N) |
| --- | --- | --- | --- |
| 1-1 | 800° C. | ±5% | 175 |
| 1-2 | 850° C. | ±4% | 200 |
| 1-3 | 880° C. | ±4% | 185 |

For the piezoelectric devices, the crystallinity was examined by X-ray diffractometry. As a result, for all the piezoelectric devices, only a perovskite structure was observed, while no pyrochlore structure was observed. Further, no peak attributable to PbO crystals was observed for any of the piezoelectric devices.

Example 2

Piezoelectric thin-film devices were prepared in the same manner as in Example 1, except that the heat treatment was performed under conditions of 860° C. and 5 sec and the degree of excess in the content of PbO in the precursor of the piezoelectric film was varied as indicated in the following table.

For the piezoelectric devices thus obtained, the deviation of Pb content in the thicknesswise direction thereof and the piezoelectric constant were as shown in Table 2.

TABLE 2

| Sample No. | Excess in Pb content (mol %) | Deviation of Pb content | Piezoelectric constant (pC/N) |
| --- | --- | --- | --- |
| 2-1 | 10 | ±3% | 185 |
| 2-2 | 20 | ±5% | 185 |
| 2-3 | 30 | ±4% | 185 |

Example 3

Piezoelectric thin-film devices were carried out in the same manner as in Example 1, except that the heat treatment was performed in two stages. The first heat treatment was carried out at a temperature, as indicated in Table 3, for one min, while the second heat treatment was carried out at 870° C. for one min.

For the piezoelectric devices thus obtained, the deviation of Pb content in the thicknesswise direction thereof and the piezoelectric constant were as shown in Table 3.

TABLE 3

| Sample No. | Temp. of 1st heat treatment | Deviation of Pb content | Piezoelectric constant (pC/N) |
| --- | --- | --- | --- |
| 3-1 | 710° C. | ±3% | 180 |
| 3-2 | 730° C. | ±5% | 190 |
| 3-3 | 750° C. | ±4% | 220 |
| 3-4 | 770° C. | ±4% | 210 |
| 3-5 | 790° C. | ±4% | 175 |

What is claimed is:

1. A piezoelectric thin-film device comprising: a piezoelectric film of a polycrystalline material; and two electrodes, the piezoelectric film being sandwiched between the two electrodes, wherein the piezoelectric film comprises a three-component composition comprising a two-component PZT constituent containing 5% by mole or more of a third component, said piezoelectric film having a thickness of not more than 5 µm, and having A lead content substantially uniformly distributed in a thickness direction of the film which varies by less than ±5%.

2. The piezoelectric thin-film device according to claim 1, wherein the piezoelectric film has a thickness in the range of from 1 to 5 µm.

3. The piezoelectric thin-film device according to claim 1, wherein the third component is represented by the following formula:

$$Pb(A_g B_h)O_3$$

wherein A represents a divalent metal selected from the group consisting of Mg, Co, Zn, Cd, Mn, and Ni or a trivalent metal selected from the group consisting of Y, Fe, Sc, Yb, Lu, In, and Cr;

B represents a quinoquevalent metal selected from the group consisting of Nb, Ta, and Sb or a sexivalent metal selected from the group consisting of W and Te;

g and h are ½, provided that when A is a trivalent metal, B is not a sexivalent metal, and vice versa; and when A represents a divalent metal with B representing a quinoquevalent metal, g is ⅓ with h being ⅔.

4. The piezoelectric thin-film device according to claim 1, wherein the third component is selected from the group consisting of lead niobate magnesium, lead niobate zinc, lead niobate nickel, and lead tungstate magnesium.

5. The piezoelectric thin-film device according to claim 1, wherein the two-component PZT constituent has the following composition $$Pb(Zr_X Ti_{1-X})O_3 + YPbO$$

wherein 0.40 ≦ X ≦ 0.6 and 0 ≦ Y ≦ 0.3.

6. A piezoelectric thin-film device comprising: a piezoelectric thin-film device according to claim 1; a monocrystalline Si substrate; and an antidiffusion film sandwiched between the monocrystalline Si substrate and the piezoelectric thin-film.

7. The piezoelectric thin-film device according to claim 6, wherein the antidiffusion film is a layer formed of zirconium oxide, thorium oxide, hafnium oxide, tantalum oxide, or aluminum oxide.

8. The piezoelectric thin-film device according to claim 6, wherein the electrode adhered to the antidiffusion film is made of platinum or palladium.

9. An ink jet recording head comprising, as a piezoelectirc transducer, a piezoelectric thin-film device according to claim 1.

10. An ink jet recording printer having an ink jet recording head according to claim 9.

* * * * *